United States Patent
Iwashige et al.

(10) Patent No.: US 9,340,700 B2
(45) Date of Patent: May 17, 2016

(54) EPOXY RESIN COMPOSITION FOR SEMICONDUCTOR ENCAPSULATION AND SEMICONDUCTOR DEVICE USING THE SAME

(75) Inventors: Tomohito Iwashige, Osaka (JP); Tomoaki Ichikawa, Osaka (JP); Naoya Sugimoto, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 306 days.

(21) Appl. No.: 13/611,559

(22) Filed: Sep. 12, 2012

(65) Prior Publication Data

US 2013/0062790 A1 Mar. 14, 2013

(30) Foreign Application Priority Data

Sep. 12, 2011 (JP) ................................. 2011-198165

(51) Int. Cl.
| | |
|---|---|
| *C08K 5/05* | (2006.01) |
| *C08K 5/053* | (2006.01) |
| *C08K 5/06* | (2006.01) |
| *C08K 5/09* | (2006.01) |
| *C08L 63/00* | (2006.01) |
| *C08L 63/02* | (2006.01) |
| *C08L 63/04* | (2006.01) |
| *H01L 23/29* | (2006.01) |
| *C09D 163/00* | (2006.01) |
| *C08G 59/62* | (2006.01) |
| *H01L 23/31* | (2006.01) |
| *C08K 5/101* | (2006.01) |
| *C08K 3/00* | (2006.01) |
| *C08K 5/5425* | (2006.01) |
| *C08L 23/26* | (2006.01) |

(52) U.S. Cl.
CPC ............ *C09D 163/00* (2013.01); *C08G 59/621* (2013.01); *C08K 5/05* (2013.01); *C08K 5/06* (2013.01); *C08L 63/00* (2013.01); *C08L 63/04* (2013.01); *H01L 23/293* (2013.01); *H01L 23/3128* (2013.01); *C08K 3/0033* (2013.01); *C08K 5/09* (2013.01); *C08K 5/101* (2013.01); *C08K 5/5425* (2013.01); *C08L 23/26* (2013.01); *H01L 2224/45144* (2013.01); *H01L 2224/48227* (2013.01); *H01L 2924/15311* (2013.01)

(58) Field of Classification Search
None
See application file for complete search history.

(56) References Cited

U.S. PATENT DOCUMENTS

| 6,180,695 B1 * | 1/2001 | Ito et al. ............. 523/451 |
| 6,180,696 B1 * | 1/2001 | Wong et al. ............. 523/457 |
| 6,467,676 B1 | 10/2002 | Wang |
| 7,825,197 B2 | 11/2010 | Takai et al. |
| 8,063,156 B2 | 11/2011 | Takai et al. |
| 2005/0261397 A1 | 11/2005 | Ito |
| 2006/0157872 A1 | 7/2006 | Kotani et al. |
| 2006/0217462 A1 * | 9/2006 | Hoshio et al. ............. 523/458 |
| 2007/0043166 A1 | 2/2007 | Hoshika |
| 2007/0106036 A1 | 5/2007 | Asano et al. |
| 2007/0265427 A1 | 11/2007 | Takai et al. |
| 2010/0308477 A1 * | 12/2010 | Akizuki et al. ............. 257/793 |
| 2011/0021722 A1 | 1/2011 | Takai et al. |

FOREIGN PATENT DOCUMENTS

| CN | 1699495 A | 11/2005 |
| CN | 1962802 A | 5/2007 |
| CN | 101072807 A | 11/2007 |
| EP | 2258772 A1 | 12/2010 |
| JP | 10-7888 A * | 1/1998 |
| JP | 10-112515 A | 4/1998 |
| JP | 2000-273154 A * | 10/2000 |
| JP | 2002-105286 A | 4/2002 |
| JP | 2004-018786 A | 1/2004 |
| JP | 2006-28259 A * | 2/2006 |
| JP | 2006-124479 A * | 5/2006 |
| JP | 2006-193566 A | 7/2006 |
| JP | 2006-274221 A | 10/2006 |
| JP | 2007-314702 A | 12/2007 |
| JP | 2010-280805 A * | 12/2010 |
| WO | 2006/080297 A1 | 8/2006 |

OTHER PUBLICATIONS

Office Action dated Apr. 21, 2015 issued by the Japanese Patent Office in counterpart Japanese Patent Application No. 2011-198165.
Office Action dated May 26, 2015 issued by the State Intellectual Property Office of the People's Republic of China in counterpart Chinese Patent Application No. 201210337024.7.
Search Report from the Singaporean Patent Office dated May 22, 2015 in a counterpart Singaporean application No. 2012067518.
Written Opinion from the Singaporean Patent Office dated May 22, 2015 in a counterpart Singaporean application No. 2012067518.
Office Action issued on Jan. 26, 2016, by the State Intellectual Property Office of P.R. China in counterpart Chinese Application No. 201210337024.7.

* cited by examiner

*Primary Examiner* — Robert Sellers
(74) *Attorney, Agent, or Firm* — Sughrue Mion, PLLC

(57) ABSTRACT

The present invention relates to an epoxy resin composition for semiconductor encapsulation, including the following components (A) to (E), in which the component (D) is contained in an amount of from 0.1 to 1.5% by weight of the whole of the epoxy resin composition: (A) an epoxy resin; (B) a phenol resin; (C) an inorganic filler; (D) a compound represented by the following formula (1) in which $R_1$ represents a hydroxyl group or an alkoxy group, $R_2$ represents a hydrogen atom or a monovalent hydrocarbon group, and n is an integer of from 1 to 7; and (E) a release agent including at least one of the following (α) and (β): (α) a linear saturated carboxylic acid having a number average molecular weight of from 550 to 800, and (β) an oxidized polyethylene wax:

$$R_1\text{-}(CH_2\text{---}CH_2\text{---}O)_n\text{-}R_2 \qquad (1).$$

5 Claims, 1 Drawing Sheet

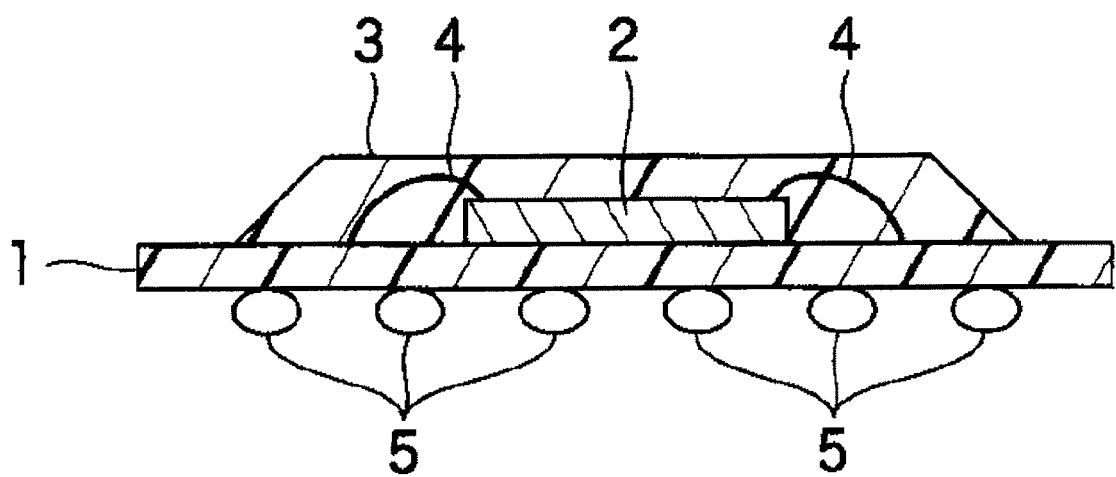

EPOXY RESIN COMPOSITION FOR SEMICONDUCTOR ENCAPSULATION AND SEMICONDUCTOR DEVICE USING THE SAME

FIELD OF THE INVENTION

The present invention relates to an epoxy resin composition for semiconductor encapsulation, having excellent suppression of warpage generation and moldability, and a semiconductor device using the same.

BACKGROUND OF THE INVENTION

In a manufacturing process of a semiconductor device, a semiconductor element after completion of bonding to a substrate is generally encapsulated with a molding resin such as a thermosetting resin in order to avoid contact with the outside. As the molding resin, for example, an epoxy resin having dispersed therein an inorganic filler including a silica powder as a main ingredient is used. For example, a transfer molding method including placing a semiconductor element bonded to a substrate in a molding mold, pressure-feeding a molding resin in the mold, thermally curing the molding resin, and molding the resin, is put into practical use as an encapsulation method using the molding resin.

Conventionally, a resin-encapsulated semiconductor device including a semiconductor element encapsulated with a molding resin is excellent in reliability, mass productivity, costs and the like, and is therefore in widespread use in conjunction with a ceramic-encapsulated semiconductor device using ceramic as a constituent material.

A semiconductor device of a one-side encapsulated structure such as a ball grid array (BGA) has the problem that stress is generated between an encapsulation layer including a cured resin and a substrate due to difference in shrinkage between the encapsulation layer and the substrate, and warpage is generated in a package by the stress. In order to suppress the warpage generation, investigation are made to increase a glass transition temperature of a cured resin as an encapsulation resin to thereby decrease the difference in shrinkage between the cured resin and a substrate (see Patent Document 1).

Patent Document 1: JP-A-10-112515

SUMMARY OF THE INVENTION

However, a resin composition for encapsulation in which a glass transition temperature of a cured resin has been increased as described above has the problem that flame retardancy is deteriorated due to high crosslinked point density. Therefore, there is a limit on a method of increasing a glass transition temperature of a cured resin. For this reason, the actual circumstance is that an encapsulating material having suppressed warpage generation of a package, low temperature dependency of warpage and good flowability, continuous moldability and powder blocking property, by other method is demanded.

The present invention has been made in view of the above circumstances, and an object thereof is to provide an epoxy resin composition for semiconductor encapsulation, that not only suppresses warpage of a package, but reduces its temperature dependency, and has excellent flowability, continuous moldability and powder blocking property, and a semiconductor device using the same.

Namely, the present invention relates to the following items 1 to 6.

1. An epoxy resin composition for semiconductor encapsulation, including the following components (A) to (E), in which the component (D) is contained in an amount of from 0.1 to 1.5% by weight of the whole of the epoxy resin composition:
   (A) an epoxy resin;
   (B) a phenol resin;
   (C) an inorganic filler;
   (D) a compound represented by the following formula (1):

$$R_1\text{-}(CH_2\text{---}CH_2\text{---}O)_n\text{-}R_2 \qquad (1)$$

in which $R_1$ represents a hydroxyl group or an alkoxy group, $R_2$ represents a hydrogen atom or a monovalent hydrocarbon group, and n is an integer of from 1 to 7; and
   (E) a release agent comprising at least one of the following (α) and (β):
   (α) a linear saturated carboxylic acid having a number average molecular weight of from 550 to 800, and
   (β) an oxidized polyethylene wax.

2. The epoxy resin composition for semiconductor encapsulation according to item 1, in which the epoxy resin as the component (A) is an epoxy resin having a biphenyl group, represented by the following formula (2):

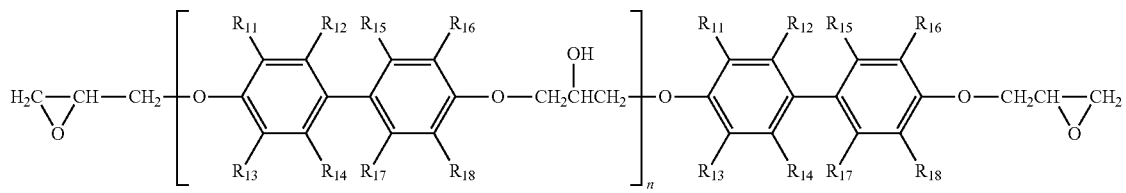

in which $R_{11}$ to $R_{18}$ which may be the same or different from each other represent hydrogen atom or a substituted or unsubstituted monovalent hydrocarbon group having from 1 to 10 carbon atoms, and n is an integer of from 0 to 3.

3. The epoxy resin composition for semiconductor encapsulation according to item 1 or 2, in which the component (D) is contained in an amount of from 0.4 to 1.5% by weight of the whole of the epoxy resin composition.

4. The epoxy resin composition for semiconductor encapsulation according to any one of items 1 to 3, in which the component (E) is contained in an amount of from 0.05 to 2.0% by weight of the whole of the epoxy resin composition.

5. The epoxy resin composition for semiconductor encapsulation according to any one of items 1 to 4, in which the release agent as the component (E) is the linear saturated carboxylic acid (α) having a number average molecular weight of from 550 to 800.

6. A semiconductor device including a semiconductor element encapsulated with the epoxy resin composition for semiconductor encapsulation according to any one of items 1 to 5.

The present inventors have earnestly and intensively conducted research to obtain a semiconductor encapsulating material that not only suppresses warpage of a package, but reduces dependency of its warpage temperature, and has excellent powder blocking property in addition of excellent flowability and continuous moldability. As a result, the inventors have found that when an ethylene glycol compound (component (D)) represented by the above formula (1) is used in a specific amount and the above specific release agent (component (E)) is further used, due to synergistic effect of those components, warpage generation can be suppressed, warpage temperature dependency is reduced, and excellent moldability and powder blocking property are obtained. The inventors have reached the present invention on the basis of the finding.

Thus, the present invention provides an epoxy resin composition for semiconductor encapsulation, including an epoxy resin (component (A)), a phenol resin (component (B)), and an inorganic filler (component (C)), the composition further including a specific amount of a specific ethylene glycol compound (compound (D)) represented by the above formula (1) and a specific release agent (compound (E)), and a semiconductor device encapsulated using the same. The composition suppresses warpage of a package, and reduces warpage temperature dependency. Furthermore, the composition has excellent powder blocking property in addition to excellent flowability and continuous moldability. As a result, use of the composition can produce a semiconductor device having high reliability in good productivity.

Furthermore, when a specific epoxy resin having a biphenyl group, represented by the formula (2) described hereinafter is used as the epoxy resin (component (A)), improvement effect of excellent flame retardancy in addition to further excellent flowability is achieved.

BRIEF DESCRIPTION OF THE DRAWING

FIG. 1 is a cross-sectional view schematically showing a one-side resin-encapsulated package.

DETAILED DESCRIPTION OF THE INVENTION

Embodiments for carrying out the present invention are described below.

The epoxy resin composition for semiconductor encapsulation (hereinafter referred to as an "epoxy resin composition" for simplicity) of the present invention is obtained using an epoxy resin (component (A)), a phenol resin (B)), an inorganic filler (component (C)), a specific compound (component (D)) and a specific release agent (component (E)), and has generally a powder form, a granular form or a tablet form obtained by tableting the powder.

A: Epoxy Resin

The epoxy resin (component (A)) can use various epoxy resins. For example, a bifunctional epoxy resin is preferably used. Above all, an epoxy resin having a biphenyl group, represented by the following formula (2) is particularly preferably used.

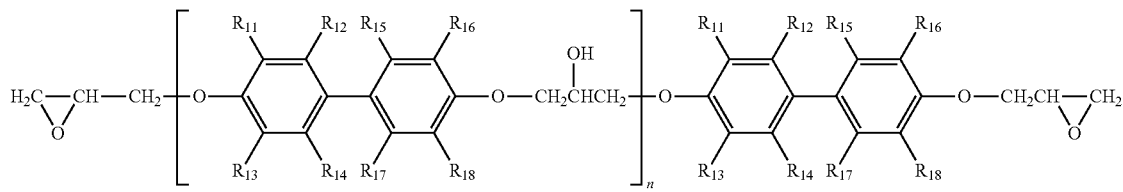

(2)

in which $R_{11}$ to $R_{18}$ which may be the same or different from each other represent hydrogen atom or a substituted or unsubstituted monovalent hydrocarbon group having from 1 to 10 carbon atoms, and n is an integer of from 0 to 3.

In the above formula (2), the substituted or unsubstituted monovalent hydrocarbon group having from 1 to 10 carbon atoms may be a saturated hydrocarbon group and may be an unsaturated hydrocarbon group. Furthermore, the substituted or unsubstituted monovalent hydrocarbon group having from 1 to 10 carbon atoms may be a linear form, a branched form or a cyclic form. The $R_{11}$ to $R_{18}$ are particularly preferably methyl group or ethyl group.

The epoxy resin having a biphenyl group represented by the above formula (2) is preferably used alone as the epoxy resin (component (A)), but other epoxy resin having different structure may be used together. For example, various epoxy resins such as a dicyclopentadiene type epoxy resin, a cresol novolak type epoxy resin, a phenol novolak type epoxy resin, a bisphenol type epoxy resin, and trishydroxyphenylmethane type epoxy resin can be used as the other epoxy resin. Of those epoxy resins, epoxy resins having a melting point or a softening point, exceeding room temperature (25±10°) are particularly preferred. For example, epoxy resins having an epoxy equivalent of from 180 to 210 and a softening point of from 60 to 110° C. are preferably used as the cresol novolak epoxy resin. Particularly, in a semiconductor device having severe requirement regarding flow of wires, a bifunctional epoxy resin is preferably used. However, from the standpoints of flowability and flame retardancy, the epoxy resin having a biphenyl group, represented by the above formula (2) is preferably used. For this reason, in the case of using other epoxy resin having different structure together with the epoxy resin having a biphenyl group, represented by the above formula (2), the epoxy resin having a biphenyl group, represented by the above formula (2) is preferably used in an amount of 60% by weight or more of the whole of the epoxy resin components.

B: Phenol Resin

The phenol resin (component (B)) functions as a curing agent for the epoxy resin (component (A)). Examples of the phenol resin include a dicyclopentadiene type phenol resin, a phenol novolak resin, a cresol novolak resin, a phenol aralkyl resin, biphenyl aralkyl type phenol resin and a triphenylmethane type phenol resin. Those phenol resins may be used alone or as mixtures of two or more thereof.

The phenol resin (component (B)) is preferably blended with the epoxy resin (component (A)) in an amount sufficient to cure the epoxy resin (component (A)). Specifically, the epoxy resin (component (A)) and the phenol resin (component (B)) are blended such that the sum of hydroxyl groups in the phenol resin (component (B)) is preferably from 0.6 to 1.2 equivalents, and more preferably from 0.7 to 1.0 equivalent, with respect to one equivalent of the epoxy groups in the epoxy resin (component (A)).

C: Inorganic Filler

Examples of the inorganic filler (component (C)) used together with the above component (A) and component (B) include quartz glass, talc, a silica powder (such as a fused silica powder or a crystalline silica powder), an alumina powder, an aluminum nitride powder, and a silicon nitride powder. Those inorganic fillers can be used in any form, such as a crushed form, a spherical form or a ground form. Those inorganic fillers are used alone or as mixtures of two or more thereof. Of those, the silica powder is preferably used in that a linear expansion coefficient of a cured product obtained can be reduced. Of the silica powders, a fused spherical silica powder is particularly preferably used from the standpoints of high filling properties and high flowability.

Furthermore, the inorganic filler (component (C)) having an average particle diameter in a range of from 5 to 40 μm is preferably used from the standpoint of improvement of flowability. The average particle diameter of the inorganic filler (component (C)) can be determined by, for example, selecting a random measurement sample from a population and measuring a particle diameter thereof using the commercially available laser diffraction/scattering particle size distribution analyzer.

The content of the inorganic filler (component (C)) is set to a range of preferably from 60 to 93% by weight, and particularly preferably from 70 to 91% by weight of the whole of the epoxy resin composition. In the case where the content of the inorganic filler (component (C)) is too small, the viscosity of the epoxy resin composition is excessively decreased, and poor appearance (formation of voids) tends to cause upon molding. On the other hand, in the case where the content is too large, flowability of the epoxy resin composition is deteriorated, tending to cause flow of wires and incomplete filling.

D: Specific Compound

The specific compound (component (D)) used together with the above components (A) to (C) is a compound represented by the following formula (1):

(1)

in which $R_1$ represents a hydroxyl group or an alkoxy group, $R_2$ represents a hydrogen atom or a monovalent hydrocarbon group, and n is an integer of from 1 to 7.

In the formula (1), $R_1$ is a hydroxyl group or an alkoxy group, and $R_2$ is a hydrogen atom or a monovalent hydrocarbon group. From a comprehensive standpoint of powder blocking property in addition to warpage temperature dependency, $R_1$ is preferably an alkoxy group, and $R_2$ is preferably a hydrogen atom or an alkyl group. $R_1$ is particularly preferably an alkoxy group having from 1 to 5 carbon atoms, and $R_2$ is particularly preferably a hydrogen atom or an alkyl group having from 1 to 3 carbon atoms. The repetition number n is preferably an integer of from 2 to 4.

The compound (component (D)) represented by the formula (1) can be synthesized by the conventional production method. For example, polyethylene glycol can be synthesized by addition-polymerizing ethylene oxide with ethylene glycol or diethylene glycol in the presence of an alkali catalyst such as sodium hydroxide or potassium hydroxide in a pressurized and moisturized state. The ethylene glycol as a raw material can be synthesized by adding ethylene oxide to water at high temperature under medium pressure. The commercially available products (for example, manufactured by Toho Chemical Industries, Ltd.) can be used as the compound (component (D)).

The content of the component (D) is required to be set to a range of from 0.1 to 1.5% by weight of the whole of the epoxy resin composition from the standpoint of the suppression effect of warpage. Considering powder blocking property in addition to the suppression effect of warpage, the content is particularly preferably from 0.4 to 1.5% by weight. in the case where the content of the component (D) is too small, the suppression effect of warpage generation and reduction effect of warpage temperature dependency are not achieved. On the other hand, in the case where the content of the compound (D) is too large, the assurance of good powder blocking property are difficult.

E: Specific Release Agent

The specific release agent (component (E)) used together with the above components (A) to (D) is used to secure improvement of continuous moldability in the present invention, and includes at least one of the following (α) and (β). Of the specific release agent (component (E)), a linear saturated carboxylic acid which is (α) below is particularly preferably used from the standpoint that deterioration of viscosity of a resin is not allowed to cause. On the other hand, the combined use of the following (α) and (β) is preferred from the standpoint of improvement of continuous moldability (anti-staining properties).

(α) a linear saturated carboxylic acid having a number average molecular weight of from 550 to 800.

(β) an oxidized polyethylene wax.

The linear saturated carboxylic acid (α) is specifically a compound represented by the following formula (3):

(3)

in which n is an integer of from 32 to 52.

In the formula (3), the repetition number n is from 32 to 52, but actually is appropriately selected such that the number average molecular weight is a value satisfying from 550 to 800. Specifically, Unicid manufactured by Baker Petrorite, and the like are used as the linear saturated carboxylic acid (α).

The linear saturated carboxylic acid (α) that can be used is required to have a number molecular weight of from 550 to 800, and particularly preferably from 600 to 800. In the case where the number average molecular weight is too small, the release agent oozes on a surface of a package, and the surface of a package tends to stain. On the other hand, the linear saturated carboxylic acid having large number average molecular weight exceeding the above arrange is substantially difficult to get and produce, and is therefore not realistic to use.

The number average molecular weight can be measured by, for example, as follows. A sample (linear saturated carboxylic acid (α)) is dissolved in an amount of 0.1% by weight in tetrahydrofuran (THF), and a number average molecular weight in terms of polystyrene can be measured using GPC (gel permeation chromatography). Measurement conditions in this case are described below.

Measurement Conditions

GPC apparatus: HLC-8120GPC (manufactured by Tosoh Corporation)

Column: [(GMHHR-H)+(GMHHR-H)+(G2000HHR)] (manufactured by Tosoh Corporation)

Flow rate: 0.8 ml/min
Concentration: 0.1% by weight
Injection amount: 100 μl
Column temperature: 40° C.
Eluent: Tetrahydrofuran (THF)

The oxidized polyethylene wax (β) is preferably used by appropriately selecting numerical values of a drop point, an acid value, a number average molecular weight, a density, an average particle diameter and the like. Specifically, it is preferred that the drop point is a range of from 100 to 130° C., the acid value is a range of from 10 to 70 mgKOH/g, the number average molecular weight is a range of from 800 to 3,000, and the density is a range of from 0.8 to 1.1 g/cm$^3$. For example, PED-136, PED-521 and the like, manufactured by Clariant can be used as the oxidized polyethylene wax (β) having such properties.

In the epoxy resin composition of the present invention, general release agents can be used together with the above specific release agent (component (E)). Examples of the general release agents include compounds such as general higher aliphatic acid esters and higher aliphatic acid calcium. For example, carnauba wax, polyethylene type wax and the like are used. Those are used alone or as mixtures of two or more thereof. The specific release agent (component (E)) is preferably used alone as a release agent component. In the case of using the specific release agent (component (E)) together with the general release agents, the specific release agent (component (E)) is preferably blended such that the amount of the specific release agent (component (E)) is 20% by weight or more of the whole of the release agent components.

The content of the specific release agent (component (E)) is preferably from 0.05 to 2.0% by weight, and particularly preferably from 0.1 to 0.5% by weight, of the whole of the epoxy resin composition. In the case where the content of the component (E) is too small or too large, it is difficult to contribute to warpage suppression and further surely secure continuous moldability while maintaining flame retardancy, flowability and powder blocking property.

Various Additives

If necessary, the epoxy resin composition of the present invention can appropriately contain various additives such as a curing accelerator, a silane coupling agent, a flame retardant, an ion trapping agent, a stress reducing agent, a pigment such as carbon black, and a colorant, in addition to the above components (A) to (E).

As the curing accelerator, various compounds exerting an action for accelerating curing can be used. Examples of the curing accelerator include a phosphorus compound, a tertiary amine, a quaternary ammonium salt, imidazoles, and a boron compound. Those are used alone or as mixtures of two or more thereof. Of those, an imidazole compound represented by the following formula (4) is preferably used from the standpoints of moldability and curability. Specific example of the imidazole compound is 2-phenyl-4-methyl-5-hydroxymethylimidazole.

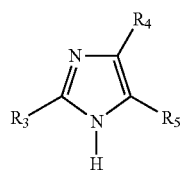

(4)

in which $R_3$ represents an alkyl group or an aryl group, and $R_4$ and $R_5$ which may be the same or different from each other represent —$CH_3$ or —$CH_2OH$, provided that at least one of $R_4$ and $R_5$ is —$CH_2OH$.

The content of the curing accelerator is set to a range of preferably from 1.0 to 12.0% by weight, and more preferably from 3.0 to 10.0% by weight, based on the weight of the phenol resin (component (B)).

Silane coupling agents having two or more alkoxyl groups are preferably used as the above silane coupling agent. Specific examples of the silane coupling agent include 3-methacryloxypropyltrimethoxysilane, β-(3,4-epoxycyclohexyl)ethyltrimethoxysilane, γ-glycidoxypropyltrimethoxysilane, γ-mercaptopropyltrimethoxysilane, γ-(2-aminoethyl)aminopropyltrimethoxysilane, γ-mercaptopropylmethyldimethoxysilane, γ-anilinopropyltrimethoxysilane and hexamethyldisilazane. Those silane coupling agents are used alone or as mixtures of two or more thereof.

Examples of the flame retardant include a novolak type brominated epoxy resin and a metal hydroxide. Those flame retardants may be used alone or as mixtures of two or more thereof.

As the ion trapping agent, all of the conventional compounds having the ability to trap ions can be used. Examples of the ion trapping agent used include hydrotalcites, bismuth hydroxide and yttrium oxide. Those ion trapping agents are used alone or as mixtures of two or more thereof.

Examples of the stress reducing agent include butadiene rubbers such as methyl acrylate-butadiene-styrene copolymers and methyl methacrylate-butadiene-styrene copolymers, and silicone compounds. Those stress reducing agents are used alone or as mixtures of two or more thereof.

The epoxy resin composition for semiconductor encapsulation according to the present invention can be produced, for example, as follows. The components (A) to (E) and if necessary, one or more other additives are appropriately blended according to the conventional method, and the resulting mixture is melt-kneaded under heating in a kneader such as a mixing roll. The kneaded mixture is cooled to room temperature to obtain a solid. The solid is pulverized by the conventional means. If necessary, the powder is compressed into tablets. Thus, the intended epoxy resin composition can be produced by a series of the steps.

Semiconductor Device

A method for encapsulating a semiconductor element using the epoxy resin composition thus obtained is not particularly limited. The encapsulation can be performed by the conventional molding process such as transfer molding to obtain a semiconductor device. A powder in a granular state obtained by pulverizing a solid without passing the tableting step can be applied to a compression molding method. Examples of the semiconductor device thus obtained include IC and LSI.

The semiconductor device thus obtained of the present invention includes a one-side resin-encapsulated package as shown in FIG. 1. The one-side resin-encapsulated package includes a semiconductor element mounting substrate 1, such as a bismaleimide-triazine resin (BT resin), and a semiconductor element (Si chip) 2 mounted on the substrate, only the mounting surface side of the substrate being encapsulated with an encapsulating resin 3. In FIG. 1, 4 is a bonding wire for connecting the semiconductor element 2 and a circuit part (not shown) on the semiconductor element mounting substrate 1, and 5 is a connecting solder terminal formed on other surface of the semiconductor element mounting substrate 1.

EXAMPLES

The present invention is described below by reference to the following Examples and Comparative Examples, but the invention is not construed as being limited to those Examples.

First, the following components were prepared.

Epoxy Resin
Biphenyl type epoxy resin represented by the formula (2) in which $R_{11}$ to $R_{18}$ are a methyl group, and n is 0 (epoxy equivalent: 192, melting point: 105° C.)

Phenol Resin b1
Biphenyl aralkyl type phenol resin (hydroxyl equivalent: 203, softening point: 65° C.)

Phenol Resin b2
Phenol novolak resin (hydroxyl equivalent: 104, softening point: 60° C.)

Phenol Resin b3
Triphenylmethane type phenol resin (hydroxyl equivalent: 97, softening point: 111° C.)

Curing Accelerator
2-Phenyl-4-methyl-5-hydroxymethylimidazole

Ethylene Glycol Type Compound d1 (Example)
Monoethylene glycol (number average molecular weight: 62; in the formula (1), n=1, $R_1$=OH and $R_2$=H)

Ethylene Glycol Type Compound d2 (Example)
Diethylene glycol (number average molecular weight: 106; in the formula (1), n=2, $R_1$=OH and $R_2$=H)

Ethylene Glycol Type Compound d3 (Example)
Polyethylene glycol (number average molecular weight: 194-238; in the formula (1), n=4, $R_1$=OH and $R_2$=H)

Ethylene Glycol Type Compound d4 (Example)
Polyethylene glycol (number average molecular weight: 282-326; in the formula (1), n=6, $R_1$=OH and $R_2$=H)

Ethylene Glycol Type Compound d5 (Example)
Triethylene glycol dimethyl ether (number average molecular weight: 178; in the formula (1), n=3, $R_1$=$CH_3O$ and $R_2$=$CH_3$)

Ethylene Glycol Type Compound d6 (Example)
Diethylene glycol monobutyl ether (number average molecular weight: 162; in the formula (1), n=2, $R_1$=$C_4H_9O$ and $R_2$=H)

Ethylene Glycol Type Compound d7 (Comparative Example)
Polyethylene glycol (number average molecular weight: 370-414; in the formula (1), n=8, $R_1$=OH and $R_2$=H)

Ethylene Glycol Type Compound d8 (Comparative Example)
Polyethylene glycol (number average molecular weight: 590-634; in the formula (1), n=13, $R_1$=OH and $R_2$=H)

Inorganic Filler
Spherical fused silica powder (average particle diameter: 13 μm)

Pigment
Carbon black

Flame Retardant
Magnesium hydroxide

Silane Coupling Agent
3-Methacryloxypropyltrimethoxysilane

Release Agent e1 (α: Example)
$CH_3$—$(CH_2)_n$—COOH (n=24 (average), manufactured by Baker Petrorite, Unicid-700 (number average molecular weight: 789))

Release Agent e2 (β: Example)
PED-136 (oxidized polyethylene wax, acid value: 60 mgKOH/g), manufactured by Clariant Release Agent e3 (β: Example)
PED-521 (oxidized polyethylene wax, acid value: 17 mgKOH/g), manufactured by Clariant Release Agent e4 (β: Comparative Example)
PED-190 (polyethylene wax), manufactured by Clariant Release Agent e5 (β: Comparative Example)
PED-520 (polyethylene wax), manufactured by Clariant Examples 1 to 18 and Comparative Examples 1 to 12

Components shown in Tables 1 to 4 shown below were simultaneously blended in proportions shown in the Tables, and each of the resulting blends was melt-kneaded with a mixing roller (100° C.) for 3 minutes. The molten product was cooled. The resulting solid was pulverized, and the resulting powder was compressed into tablets. Thus, the intended epoxy resin composition for semiconductor encapsulation was prepared.

Each epoxy resin composition obtained in the Examples and Comparative Examples was subjected to measurement and evaluation according to the following methods. The results obtained are shown in Tables 1 to 4 shown below.

1) Continuous Moldability

A molding mold was previously cleaned. A package was encapsulated with each of the epoxy resins obtained in the Examples and the Comparative Examples by transfer molding (molding temperature: 175° C., and molting time: 90 seconds), and this procedure was repeated. The molding shot number until the epoxy resin composition is stuck to the molding mold (sticking) or forms stain was counted, and the number when shot stopped was described.

The package used is a package produced by wire-bonding a semiconductor element (10 mm×10 mm×0.3 mm thick) to a ball grid array (BGA) substrate (35 mm×35 mm×0.5 mm thick) with a gold wire (0.02 mm diameter×4.5 mm long).

2) Warpage Temperature Dependency

A package was encapsulated with each of the epoxy resin compositions obtained in the Examples and the Comparative Examples by transfer molding (molding temperature: 175° C., molding time: 90 seconds), and the epoxy resin composition was post-cured at 175° C. for 3 hours. Thus, a molded product (one-side encapsulated package) was obtained. The package is that silicon chips (10 mm×10 mm×0.37 mm thick) were mounted on a substrate (50 mm×50 mm×0.22 mm thick, CCL-HL832, manufactured by Mitsubishi Gas Chemical Company, Inc.) in which a solder resist (PSR-4000 AUS308 manufactured by TAIYO INK MFG. Co., LTD) is applied, with a die bonding material (EM-700J, manufactured by Nitto Denko Corporation) in a form of 3 chips (long)×3 chips (wide) (total 9 chips) at intervals of 10 mm.

Warpage of the molded product obtained was measured in a range of from 25° C. to 260° C. at intervals of 10° C., and difference (μm) between the maximum value and the minimum value in the range was calculated.

3) Flowability

Spiral Flow (SF) Value

Spiral flow (SF) value (cm) was measured using a molding mold for spiral flow measurement according to the method of EMMI 1-66 under the conditions of 175±5° C., 120 seconds and 70 kg/cm².

Gelation Time (GT)

About 0.1 to 0.5 g of each epoxy resin composition obtained in the Examples and Comparative Examples was placed on a 175° C. hot flat plate, and was stirred with a glass bar having a diameter of 1.5 mm. Time until resin cobwebbing has not been observed was taken as gelation time (second). In the case of considering curability, the gelation time of 60 seconds or less is generally proper.

4) Powder Blocking Property

Each epoxy resin composition obtained in the Examples and Comparative Examples was pulverized, and allowed to stand under the conditions of 25° C. and 60% RH for 24 hours. The resulting powder was passed through a 1 mm mesh sieve. The evaluation is as follows. When the powder remained in an amount of 20% by weight or more on the sieve, the powder blocking property was judged to be "C" as Not Good. When the powder remained in an amount less than 5% by weight on the sieve, the powder blocking property was judged to be "A". When the powder remained in an amount of from 5 to less than 20% by weight on the sieve, the powder blocking property was judged to be "B".

TABLE 1

(Parts by weight)

| | | Example 1 | 2 | 3 | 4 | 5 | 6 | 7 | 8 | 9 | 10 |
|---|---|---|---|---|---|---|---|---|---|---|---|
| Epoxy resin (A) | | 6.26 | 6.02 | 6.26 | 6.02 | 6.49 | 6.26 | 6.02 | 5.67 | 6.02 | 6.02 |
| Phenol resin (B) | b1 | 2.89 | 2.78 | 2.89 | 2.78 | 3.00 | 2.89 | 2.78 | 2.62 | 2.78 | 2.78 |
| | b2 | 1.24 | 1.19 | 1.24 | 1.19 | 1.29 | 1.24 | 1.19 | 1.12 | 1.19 | 1.19 |
| | b3 | — | — | — | — | — | — | — | — | — | — |
| Curing accelerator | | 0.29 | 0.28 | 0.29 | 0.28 | 0.30 | 0.29 | 0.28 | 0.26 | 0.28 | 0.28 |
| Ethylene glycol | d1 | 0.50 | 0.90 | — | — | — | — | — | — | — | — |
| type | d2 | — | — | 0.50 | 0.90 | — | — | — | — | — | — |
| compound (D) | d3 | — | — | — | — | 0.10 | 0.50 | 0.90 | 1.50 | 0.90 | 0.90 |
| | d4 | — | — | — | — | — | — | — | — | — | — |
| | d5 | — | — | — | — | — | — | — | — | — | — |
| | d6 | — | — | — | — | — | — | — | — | — | — |
| | d7 | — | — | — | — | — | — | — | — | — | — |
| | d8 | — | — | — | — | — | — | — | — | — | — |
| Inorganic filler (C) | | 87.81 | 87.81 | 87.81 | 87.81 | 87.81 | 87.81 | 87.81 | 87.81 | 87.81 | 87.81 |
| Pigment | | 0.51 | 0.51 | 0.51 | 0.51 | 0.51 | 0.51 | 0.51 | 0.51 | 0.51 | 0.51 |
| Flame retardant | | 0.10 | 0.10 | 0.10 | 0.10 | 0.10 | 0.10 | 0.10 | 0.10 | 0.10 | 0.10 |
| Silane coupling agent | | 0.15 | 0.15 | 0.15 | 0.15 | 0.15 | 0.15 | 0.15 | 0.15 | 0.15 | 0.15 |
| Flame retardant | e1 | 0.25 | 0.25 | 0.25 | 0.25 | 0.25 | 0.25 | 0.25 | 0.25 | — | — |
| (E) | e2 | — | — | — | — | — | — | — | — | 0.25 | — |
| | e3 | — | — | — | — | — | — | — | — | — | 0.25 |
| | e4 | — | — | — | — | — | — | — | — | — | — |
| | e5 | — | — | — | — | — | — | — | — | — | — |
| SF value (cm) | | 189 | 192 | 195 | 200 | 188 | 193 | 198 | 203 | 174 | 176 |
| Gelation time (sec) | | 42 | 42 | 42 | 43 | 42 | 42 | 43 | 47 | 39 | 38 |
| Continuous moldability (Number when shot stopped) | | >500 | >500 | >500 | >500 | >500 | >500 | >500 | >500 | >500 | >500 |
| Warpage temperature dependency (μm) | | 582 | 554 | 559 | 393 | 603 | 572 | 465 | 312 | 471 | 469 |
| Powder blocking property | | B | B | B | B | A | B | B | B | B | B |

TABLE 2

(parts by weight)

| | | Example 11 | 12 | 13 | 14 | 15 | 16 | 17 | 18 |
|---|---|---|---|---|---|---|---|---|---|
| Epoxy resin (A) | | 6.26 | 6.02 | 6.02 | 6.02 | 6.95 | 6.69 | 6.26 | 6.26 |
| Phenol resin (B) | b1 | 2.89 | 2.78 | 2.78 | 2.78 | — | — | 2.89 | 2.89 |
| | b2 | 1.24 | 1.19 | 1.19 | 1.19 | — | — | 1.24 | 1.24 |
| | b3 | — | — | — | — | 3.52 | 3.39 | — | — |
| Curing accelerator | | 0.29 | 0.28 | 0.28 | 0.28 | 0.21 | 0.20 | 0.29 | 0.29 |
| Ethylene glycol type | d1 | — | — | — | — | — | — | 0.5 | 0.5 |
| compound (D) | d2 | — | — | — | — | — | — | — | — |
| | d3 | — | — | — | — | 0.50 | 0.90 | — | — |
| | d4 | 0.50 | 0.90 | — | — | — | — | — | — |
| | d5 | — | — | 0.90 | — | — | — | — | — |
| | d6 | — | — | — | 0.90 | — | — | — | — |
| | d7 | — | — | — | — | — | — | — | — |
| | d8 | — | — | — | — | — | — | — | — |
| Inorganic filler (C) | | 87.81 | 87.81 | 87.81 | 87.81 | 87.81 | 87.81 | 87.96 | 87.56 |
| Pigment | | 0.51 | 0.51 | 0.51 | 0.51 | 0.51 | 0.51 | 0.51 | 0.51 |
| Flame retardant | | 0.10 | 0.10 | 0.10 | 0.10 | 0.10 | 0.10 | 0.10 | 0.10 |
| Silane coupling agent | | 0.15 | 0.15 | 0.15 | 0.15 | 0.15 | 0.15 | 0.15 | 0.15 |
| Flame retardant (E) | e1 | 0.25 | 0.25 | 0.25 | 0.25 | 0.25 | 0.25 | 0.1 | 0.5 |
| | e2 | — | — | — | — | — | — | — | — |
| | e3 | — | — | — | — | — | — | — | — |
| | e4 | — | — | — | — | — | — | — | — |
| | e5 | — | — | — | — | — | — | — | — |

TABLE 2-continued

| | Example (parts by weight) | | | | | | | |
|---|---|---|---|---|---|---|---|---|
| | 11 | 12 | 13 | 14 | 15 | 16 | 17 | 18 |
| SF value (cm) | 188 | 191 | 190 | 195 | 194 | 197 | 190 | 190 |
| Gelation time (sec) | 42 | 42 | 43 | 43 | 43 | 44 | 42 | 42 |
| Continuous moldability (Number when shot stopped) | >500 | >500 | >500 | >500 | >500 | >500 | >410 | >500 |
| Warpage temperature dependency (μm) | 436 | 463 | 452 | 421 | 585 | 472 | 589 | 548 |
| Powder blocking property | B | B | A | A | B | B | B | B |

TABLE 3

| | | Comparative Example (parts by weight) | | | | | | | | |
|---|---|---|---|---|---|---|---|---|---|---|
| | | 1 | 2 | 3 | 4 | 5 | 6 | 7 | 8 | 9 |
| Epoxy resin (A) | | 6.55 | 6.26 | 6.02 | 6.26 | 6.02 | 6.02 | 6.02 | 6.50 | 5.38 |
| Phenol resin (B) | b1 | 3.03 | 2.89 | 2.78 | 2.89 | 2.78 | 2.78 | 2.78 | 3.01 | 2.49 |
| | b2 | 1.30 | 1.24 | 1.19 | 1.24 | 1.19 | 1.19 | 1.19 | 1.29 | 1.07 |
| | b3 | — | — | — | — | — | — | — | — | — |
| Curing accelerator | | 0.30 | 0.29 | 0.28 | 0.29 | 0.28 | 0.28 | 0.28 | 0.30 | 0.25 |
| Ethylene glycol type compound (D) | d1 | — | — | — | — | — | — | — | — | — |
| | d2 | — | — | — | — | — | — | — | — | — |
| | d3 | — | — | — | — | — | 0.90 | 0.90 | 0.08 | 2.00 |
| | d4 | — | — | — | — | — | — | — | — | — |
| | d5 | — | — | — | — | — | — | — | — | — |
| | d6 | — | — | — | — | — | — | — | — | — |
| | d7 | — | 0.50 | 0.90 | — | — | — | — | — | — |
| | d8 | — | — | — | 0.50 | 0.90 | — | — | — | — |
| Inorganic filler (C) | | 87.81 | 87.81 | 87.81 | 87.81 | 87.81 | 87.81 | 87.81 | 87.81 | 87.81 |
| Pigment | | 0.51 | 0.51 | 0.51 | 0.51 | 0.51 | 0.51 | 0.51 | 0.51 | 0.51 |
| Flame retardant | | 0.10 | 0.10 | 0.10 | 0.10 | 0.10 | 0.10 | 0.10 | 0.10 | 0.10 |
| Silane coupling agent | | 0.15 | 0.15 | 0.15 | 0.15 | 0.15 | 0.15 | 0.15 | 0.15 | 0.15 |
| Flame retardant (E) | e1 | 0.25 | 0.25 | 0.25 | 0.25 | 0.25 | — | — | 0.25 | 0.25 |
| | e2 | — | — | — | — | — | — | — | — | — |
| | e3 | — | — | — | — | — | — | — | — | — |
| | e4 | — | — | — | — | — | 0.25 | — | — | — |
| | e5 | — | — | — | — | — | — | 0.25 | — | — |
| SF value (cm) | | 185 | 185 | 186 | 184 | 185 | 175 | 178 | 186 | 212 |
| Gelation time (sec) | | 42 | 42 | 44 | 41 | 42 | 40 | 40 | 42 | 49 |
| Continuous moldability (Number when shot stopped) | | >500 | >500 | >500 | >500 | >500 | 134 | 112 | >500 | >500 |
| Warpage temperature dependency (μm) | | 636 | 621 | 618 | 630 | 641 | 468 | 452 | 610 | 278 |
| Powder blocking property | | A | B | B | B | B | B | B | A | C |

TABLE 4

| | | Comparative Example (parts by weight) | | |
|---|---|---|---|---|
| | | 10 | 11 | 12 |
| Epoxy resin (A) | | 7.27 | 6.95 | 6.69 |
| Phenol resin (B) | b1 | — | — | — |
| | b2 | — | — | — |
| | b3 | 3.69 | 3.52 | 3.39 |
| Curing accelerator | | 0.22 | 0.21 | 0.20 |
| Ethylene glycol type compound (D) | d1 | — | — | — |
| | d2 | — | — | — |
| | d3 | — | — | — |
| | d4 | — | — | — |
| | d5 | — | — | — |
| | d6 | — | — | — |
| | d7 | — | 0.50 | 0.90 |
| | d8 | — | — | — |
| Inorganic filler (C) | | 87.81 | 87.81 | 87.81 |
| Pigment | | 0.51 | 0.51 | 0.51 |
| Flame retardant | | 0.10 | 0.10 | 0.10 |
| Silane coupling agent | | 0.15 | 0.15 | 0.15 |
| Flame retardant (E) | e1 | 0.25 | 0.25 | 0.25 |
| | e2 | — | — | — |
| | e3 | — | — | — |
| | e4 | — | — | — |
| | e5 | — | — | — |
| SF value (cm) | | 182 | 184 | 185 |
| Gelation time (sec) | | 40 | 41 | 42 |
| Continuous moldability (Number when shot stopped) | | >500 | >500 | >500 |

TABLE 4-continued

| | (parts by weight) Comparative Example | | |
|---|---|---|---|
| | 10 | 11 | 12 |
| Warpage temperature dependency (μm) | 641 | 623 | 619 |
| Powder blocking property | A | B | B |

It is seen from the above results that the epoxy resin compositions of the Examples use all of the components (A) to (E), and have improved warpage temperature dependency as compared with the epoxy resin compositions of the Comparative Examples, good evaluation results are obtained in other evaluation items (moldability, flowability and powder blocking property), and from this fact, a practically excellent epoxy resin composition for semiconductor encapsulation was obtained.

It is further seen that the amount of the ethylene glycol type compound blended which is the component (D) must be from 0.1 to 1.5% by weight of the whole of the epoxy resin composition, considering suppression effect of warpage, but from the standpoints of both of suppression effect of warpage and powder blocking property, the blending amount is preferably from 0.4 to 1.5% by weight. Furthermore, it is seen from the measurement results of Examples 13 and 14 that in the ethylene glycol type compound as the component (D), $R_1$ in the formula (1) is more preferably an alkoxy group, not OH group, from the standpoints of warpage temperature dependency and additionally powder blocking property.

On the other hand, it is apparent that the epoxy resin compositions of Comparative Examples 2 to 5, 11 and 12 that use the ethylene glycol type compounds d7 and d8 for Comparative Examples as the component (D) and the epoxy resin compositions of Comparative Examples 1 and 10 that do not use the ethylene glycol type compound have high warpage temperature dependency and cannot achieve the suppress effect of warpage.

It is further apparent that the epoxy resin composition of Comparative Example 8 having the constitution that the blending amount of the ethylene glycol type compound as the component (D) falls outside the specific range and is lower than the lower limit cannot achieve the suppression effect of warpage, and the epoxy resin composition of Comparative Example 9 having the constitution that the blending amount of the ethylene glycol type compound as the component (D) falls outside the specific range and exceeds the upper limit cannot achieve good powder blocking property.

It is apparent that the epoxy resin compositions of Comparative Examples 6 and 7 using polyethylene wax acting as a release agent other than (α) and (β) of the component (E) of the present invention are that measurement result of the continuous moldability is remarkably low, and as a result, continuous moldability is poor.

While the invention has been described in detail with reference to specific embodiments thereof, it will be apparent to one skilled in the art that various changes and modifications can be made therein without departing from the spirit and scope thereof.

Incidentally, the present application is based on Japanese Patent Application No. 2011-198165 filed on Sep. 12, 2011, and the contents are incorporated herein by reference.

All references cited herein are incorporated by reference herein in their entirety.

The epoxy resin composition for semiconductor encapsulation of the present invention shows excellent characteristics in moldability and high temperature and high humidity reliability, and is therefore useful as an encapsulation material in various semiconductor devices such as a one-side resin-encapsulated package.

DESCRIPTION OF REFERENCE NUMERALS AND SIGNS

1 Semiconductor element mounting substrate (BT resin)
2 Semiconductor element (Si chip)
3 Encapsulating resin
4 Bonding wire
5 Solder terminal

What is claimed is:

1. An epoxy resin composition for semiconductor encapsulation, comprising the following components (A) to (E), wherein the component (D) is contained in an amount of from 0.4 to 1.5% by weight of the entire epoxy resin composition:
   (A) an epoxy resin;
   (B) a phenol resin;
   (C) an inorganic filler;
   (D) a compound represented by the following formula (1):

$$R_1\text{-}(CH_2\text{---}CH_2\text{---}O\text{-})_n R_2 \quad (1)$$

in which $R_1$ represents an alkoxy group, having from 1 to 5 carbon atoms, $R_2$ represents a hydrogen atom or an alkyl group having from 1 t 3 carbon atoms, and n is an integer of from 1 to 7; and
   (E) a release agent comprising at least one of the following (α) and (β):
   (α) a linear saturated carboxylic acid having a number average molecular weight of from 550 to 800, and
   (β) an oxidized polyethylene wax,
   wherein the component (E) is contained in an amount of from 0.05 to 2.0% by weight of the whole of the epoxy resin composition.

2. The epoxy resin composition for semiconductor encapsulation according to claim 1, wherein the epoxy resin as the component (A) is an epoxy resin having a biphenyl group, represented by the following formula (2)

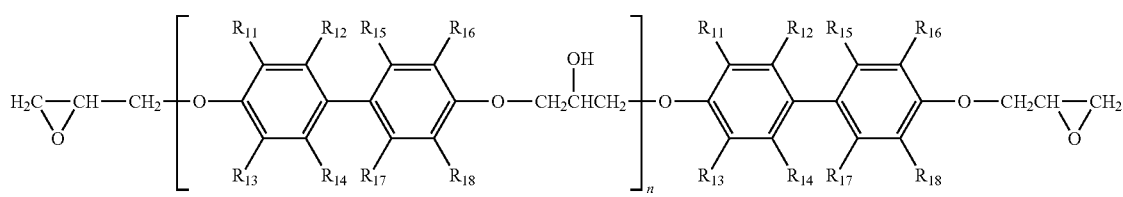

in which $R_1$ to $R_{18}$ which are the same or different from each other represent hydrogen atom or a substituted or unsubstituted monovalent hydrocarbon group having from 1 to 10 carbon atoms, and n is an integer of from 0 to 3.

3. The epoxy resin composition for semiconductor encapsulation according to claim 1, wherein the component (D) is contained in an amount of from 0.4 to 1.5% by weight of the entire epoxy resin composition.

4. The epoxy resin composition for semiconductor encapsulation according to claim 1, wherein the release agent as the component (E) is the linear saturated carboxylic acid ($\alpha$) having a number average molecular weight of from 550 to 800.

5. A semiconductor device comprising a semiconductor element encapsulated with the epoxy resin composition for semiconductor encapsulation according to claim 1.

* * * * *